United States Patent [19]

Matsumura et al.

[11] Patent Number: 5,932,889

[45] Date of Patent: Aug. 3, 1999

[54] SEMICONDUCTOR DEVICE WITH FLOATING QUANTUM BOX

[75] Inventors: Kohji Matsumura; Yasoo Harada, both of Hirakata, Japan

[73] Assignee: Sanyo Electric Co., Ltd., Osaka-fu, Japan

[21] Appl. No.: 08/561,124

[22] Filed: Nov. 20, 1995

[30] Foreign Application Priority Data

Nov. 22, 1994 [JP] Japan .................................... 6-287698

[51] Int. Cl.⁶ ...................... H01L 29/06; H01L 31/0328; H01L 31/0336
[52] U.S. Cl. .............................. 257/14; 257/24; 257/192
[58] Field of Search .................. 257/14, 24, 29, 257/192, 194

[56] References Cited

U.S. PATENT DOCUMENTS

| 5,198,879 | 3/1993 | Ohshima | 257/24 |
|---|---|---|---|
| 5,283,445 | 2/1994 | Saito | 257/24 |
| 5,313,484 | 5/1994 | Arimoto | 257/14 |
| 5,430,309 | 7/1995 | Ugajin | 257/14 |
| 5,608,231 | 3/1997 | Ugajin et al. | 257/24 |

OTHER PUBLICATIONS

*Physics of Semiconductor Devices* (Second Edition), S.M. Sze, Bell Laboratories, Inc. (1991).
*International Electron Devices Meeting,* Technical Digest, Washington, DC, (1993).
*53rd Annual Device Research Conference Digest,* University of Virginia (1995).
Physics of Semiconductor Devices, 1981.
International Electron Devices meeting 1993.
53th Annual Device Research Conference Digest, 1995.

*Primary Examiner*—Wael Fahmy
*Attorney, Agent, or Firm*—Darby&Darby

[57] ABSTRACT

An undoped $Al_{0.22}Ga_{0.78}As$ spacer layer having a large forbidden bandgap and an $N-Al_{0.22}Ga_{0.78}As$ electron-supplying layer having a large forbidden bandgap are formed in order on an undoped GaAs buffer layer having a small forbidden bandgap, and InAs quantum boxes are provided in the $Al_{0.22}Ga_{0.78}As$ spacer layer. The size of the InAs quantum box is about 150 Å and the height is about 40 Å. When a predetermined drain voltage is applied, electrons are accumulated in the InAs quantum boxes from a channel formed in the vicinity of the interface with the $Al_{0.22}Ga_{0.78}As$ spacer layer in the GaAs buffer layer. Accordingly, a drain current will not flow almost at all even if a drain voltage is applied.

34 Claims, 13 Drawing Sheets

(a) ERASING  (b) WRITING

VG > WRITING
VG < ERASING

SEMICONDUCTOR DEVICE WITH FLOATING QUANTUM BOX

BACKGROUND OF THE INVENTION

1. Field of the Invention

The present invention relates to a semiconductor device used as an element for a memory or as an element for a digital logic circuit.

In this specification, a quantum box is defined as a structure which confines electrons or holes in a size of not more than 1000 Å in three directions normal to one another.

2. Description of the Background Art

FIG. 19 is a schematic sectional view showing structure of a floating gate MOS transistor used as a memory cell of an EEPROM (Electrically Erasable and Programmable Read Only Memory).

In FIG. 19, a source region 72 and a drain region 73 formed of n$^+$ layers are formed at a certain interval in the surface of a p-type Si substrate 71. A floating gate 75 is formed on the region between the source region 72 and the drain region 73 through a tunnel oxide film 74, and further a control gate 77 is formed through a thick oxide film 76. The reference numeral 78 indicates an insulating film for element isolation.

FIGS. 20(a), (b), and (c) show energy band diagrams in writing, holding and erasing of the floating gate MOS transistor of FIG. 19, respectively. In FIG. 20, $E_F$ indicates the energy level of the Fermi level, $E_C$ indicates the energy level at the lower end of a conduction band and $E_V$ indicates the energy level at the upper end of a valence band.

The source region 72 is supplied with a source potential (ground potential) $V_S$ and the drain region 73 is supplied with a drain voltage $V_D$. Thus, a channel is formed between the source region 72 and the drain region 73.

When writing, a high positive gate voltage $V_{CG}$ is applied to the control gate 77. Thus, electrons are injected by the tunneling phenomenon into the floating gate 75 from the channel formed between the source region 72 and the drain region 73. In a holding state, electrons are accumulated in the floating gate 75. When erasing, a negative high gate voltage $V_{CG}$ is applied to the control gate 77. Thus, electrons in the floating gate 75 are emitted into the channel formed between the source region 72 and the drain region 73.

In this way, the floating gate MOS transistor operates as a writable and erasable non-volatile memory element.

On the other hand, the SET (Single Electron Tunneling) phenomenon has attracted special interest recently. The SET phenomenon will now be briefly described. If capacitance of a fine junction is taken as C, then the Coulomb energy U(n) of the fine junction having n electrons is given by the equation below.

$$U(n)=(ne)^2/2C \quad (1)$$

Now, e is a unit electric charge amount. From the equation (1), the Coulomb energy $\Delta U$ necessary to add an electron to this fine junction is given by the equation below.

$$\Delta U=U(n+1)-U(n)-e^2/2C \quad (2)$$

Generally, as the capacitance of the tunnel junction is relatively large, the Coulomb energy $\Delta U$ of the equation (2) is smaller than the thermal energy. Accordingly, the electron is thermally excited and can tunnel the fine junction. Hence, even if an electron is added to the fine junction with the Coulomb energy $\Delta U$, the electron will be emitted from the fine junction by the tunneling.

Recently, however, the progress in the fine processing technique has enabled formation of a fine junction of about 1000 Å. For example, in the case of a fine junction having its one side of 1000 Å and a barrier thickness 100 Å, the Coulomb energy $\Delta U$ corresponds to thermal energy of about 10 K. Accordingly, if the temperature is decreased to 10 K or below, the electron can not freely tunnel the fine junction any more. In this case, electrons are accumulated in the fine junction one by one by tunnelling every time the Coulomb energy $\Delta U$ is externally supplied. These days, various elements such as a single electron transistor etc. utilizing the SET phenomenon are suggested and manufactured by way of trial.

In the above-described floating gate MOS transistor, it is necessary to have the tunnel oxide film 74 thick in order to prevent electrons from escaping by tunneling from the floating gate 75 into the channel in the holding state. Therefore, it is necessary to apply a high gate voltage $V_{CG}$ to allow electrons to tunnel in writing and erasing.

This will result in increased power consumption and low operation speed. Furthermore, a high electric field produced when the high voltage is applied deteriorates the tunnel oxide film 74 and the number of times of writing and erasing will decrease. As shown in FIG. 21, the number of times of writing and erasing of the floating gate MOS transistor is about 10$^5$ times.

Further, as the operation of the above-described floating gate MOS transistor requires a large number of electrons, the element will not operate when the element is miniaturized to a certain extent for higher integration. Although various elements are suggested and manufactured by way of trial which use the SET phenomenon for higher integration, practical elements have not actually been developed yet because of various problems, such as those in the manufacturing technique, operation temperature, etc.

SUMMARY OF THE INVENTION

It is an object of the present invention to provide a practical semiconductor device with small power consumption and a long life, and capable of high integration and high speed operation.

It is another object of the present invention to provide a semiconductor device with small power consumption and a long life, and capable of high integration and high speed operation and which can be used as an element for a memory or an element for a digital logic circuit.

A semiconductor device according to the present invention includes a channel region in which electrons drift, and a quantum box provided in the vicinity of the channel region with a potential barrier interposed therebetween, for accumulating an electron.

In the semiconductor device, since the junction capacitance between the quantum box and the channel region is extremely small, the Coulomb energy for accumulating an electron in the quantum box is larger than the energy of temperature. Accordingly, external energy is necessary to accumulate an electron in the quantum box. When an electron is accumulated in the quantum box, the internal potential energy of the quantum box increases and the electron is stably accumulated in the quantum box, and emission of the electron by tunneling is prevented.

When no electron is accumulated in the quantum box, electrons can freely drift in the channel. On the other hand, if an electron is accumulated in the quantum box, the electron concentration in the channel is decreased due to the movement of part of electrons in the channel into the quantum box, and the electrons in the channel are subject to the Rutherford scattering by the electron in the quantum box so that the electrons can not freely drift in the channel, resulting in higher resistance of the channel. Accordingly, this semiconductor device can be used as an element for a memory or an element for a digital logic circuit.

Once an electron is injected into the quantum box, an increase of the internal potential energy allows the electron to be stably accumulated in the quantum box, which saves the need of a thick potential barrier. Hence, an electron can be injected into the quantum box from the channel with a low voltage. This results in small power consumption and a long life. Furthermore, the extremely small junction capacitance between the quantum box and the channel enables high speed operation. Moreover, its simple structure facilitates high integration, and it can be considerably miniaturized in principle because it is sufficient to accumulate at least one electron in the quantum box.

Now, this semiconductor device operates at a temperature T [K] under the conduction given as;

$$\Delta U = e^2/2C > kT$$

Accordingly, reducing the size of the quantum box to reduce the junction capacitance between the quantum box and the channel enables operation at a room temperature. For example, if T=300 [K], then $C < -3 \times 10^{-18}$ [F].

The semiconductor device may further include first and second electrodes for supplying electrons into the channel region. In this case, application of a low voltage between the first and second electrodes can cause an electron to be injected into the quantum box from the channel region and application of light can cause the electron to be emitted from the quantum box into the channel region.

The semiconductor device may further include a third electrode provided between the channel region and the quantum box for producing an electric field. In this case, application of a low positive voltage to the third electrode can cause an electron to be injected into the quantum box from the channel region, and application of a low reverse voltage to the third electrode can cause the electron to be emitted from the quantum box to the channel region.

If the present invention is applied to a modulation dope type semiconductor device, the semiconductor device may comprise a hetero structure including a first semiconductor including a layer doped with impurity and an undoped second semiconductor having a second forbidden bandgap smaller than a forbidden bandgap of the first semiconductor, and a quantum box provided in the first semiconductor for accumulating an electron, the quantum box including a semiconductor having a forbidden bandgap smaller than the forbidden bandgap of the first semiconductor. That is to say, the quantum box may be provided in the first semiconductor having a large forbidden bandgap. The first semiconductor may include an undoped layer between the impurity-doped layer and the second semiconductor.

The semiconductor device may further include first and second electrodes for supplying electrons to a channel formed in the second semiconductor from the first semiconductor side. In this case, application of a low voltage between the first and second electrodes can cause an electron to be injected into the quantum box from the channel in the second semiconductor and application of light can cause the electron to be emitted from the quantum box into the channel in the second semiconductor.

The semiconductor device may further include a third electrode for producing an electric field between the channel in the second semiconductor and the quantum box. In this case, application of a low positive voltage to the third electrode can cause an electron to be injected into the quantum box from the channel and application of a low reverse voltage to the third electrode can cause the electron to be emitted from the quantum box to the channel.

Particularly, it is preferred that the capacitance between the channel formed in the second semiconductor and the quantum box is smaller than about $10^{-16}$ F. This enables the semiconductor device to operate at a temperature of 1K or higher.

The semiconductor device may further include a third semiconductor provided adjacent to the channel formed in the second semiconductor and having a forbidden bandgap smaller than the forbidden bandgap of the second semiconductor. In this case, the electron concentration of the channel increases and the resistance of the channel is reduced. Further, the effect of substantially increasing the distance between the quantum box and the channel is obtained, which further reduces the junction capacitance between the quantum box and the channel.

The semiconductor device may further include a fourth semiconductor provided between the quantum box in the first semiconductor and the second semiconductor and having a forbidden bandgap larger than the forbidden bandgap of the first semiconductor. This prevents transition by tunneling of electrons into the quantum box from the channel.

The first semiconductor may be composed of one or a plurality of semiconductor(s) selected from the group consisting of an AlGaAs system, an InAlAs system, an InAlGaAs system, a GaAsP system and an AlGaAsP system, the second semiconductor may be composed of one or a plurality of semiconductor(s) selected from the group consisting of a GaAs system, an InGaAs system and an InP system, and the quantum box may be composed of one or a plurality of semiconductor(s) selected from the group consisting of an InAs system, an InGaAs system, an GaSb system, and an InSb system.

If the present invention is applied to a modulation dope type semiconductor device, the semiconductor device may comprise a hetero structure including a first semiconductor including a layer doped with impurity and an undoped second semiconductor having a forbidden bandgap smaller than the forbidden bandgap of the first semiconductor, and a quantum box provided in the second semiconductor for accumulating an electron, the quantum box including a semiconductor having a forbidden bandgap smaller than the forbidden bandgap of the second semiconductor. That is to say, the quantum box may be provided in the second semiconductor having a small forbidden bandgap. The first semiconductor may include an undoped layer between the impurity-doped layer and the second semiconductor.

The semiconductor device may further include first and second electrodes for supplying electrons to a channel formed in the second semiconductor from the second semiconductor side. In this case, application of a low voltage between the first and second electrodes can cause an electron to be injected into the quantum box from the channel in the second semiconductor and application of light can cause the electron to be emitted from the quantum box into the channel in the second semiconductor.

The semiconductor device may further include a third electrode for producing an electric field between the channel in the second semiconductor and the quantum box. In this case, application of a low positive voltage to the third electrode can cause an electron to be injected into the quantum box from the channel and application of a low reverse voltage to the third electrode can cause the electron to be emitted from the quantum box to the channel.

Particularly, it is preferred that the capacitance between the channel formed in the second semiconductor and the quantum box is smaller than about $10^{-16}$ F. This enables the semiconductor device to operate at a temperature of 1K or higher.

The semiconductor device may further include a third semiconductor provided adjacent to the channel in the second semiconductor and having a forbidden bandgap smaller than the forbidden bandgap of the second semiconductor. In this case, the electron concentration of the channel increases and the resistance of the channel is reduced. Further, the effect of substantially increasing the distance between the quantum box and the channel is obtained, which further reduces the junction capacitance between the quantum box and the channel.

The semiconductor device may further include a fourth semiconductor provided between a channel formed in the second semiconductor and the quantum box and having a forbidden bandgap larger than the forbidden bandgap of the second semiconductor. This prevents transition by tunneling of electrons into the quantum box from the channel.

The first semiconductor may be composed of one or a plurality of semiconductor(s) selected from the group consisting of an AlGaAs system, an InAlAs system, an InAlGaAs system, a GaAsP system and an AlGaAsP system, the second semiconductor may be composed of one or a plurality of semiconductor(s) selected from the group consisting of a GaAs system, an InGaAs system and an InP system, and the quantum box may be composed of one or a plurality of semiconductor(s) selected from the group consisting of an InAs system, an InGaAs system, a GaSb system, and an InSb system.

If the present invention is applied to a MOS system semiconductor device, the semiconductor device may comprise a first semiconductor having a channel formed therein in which electrons drift, a second semiconductor or insulator formed on the first semiconductor and having a forbidden bandgap larger than the forbidden bandgap of the first semiconductor, and a quantum box provided on the second semiconductor or insulator for accumulating an electron, the quantum box including a semiconductor or metal having a forbidden bandgap not more than the forbidden bandgap of the first semiconductor. That is to say, the quantum box may be provided on the first semiconductor through a semiconductor or an insulator having a large forbidden bandgap.

The semiconductor device may further include first and second electrodes for supplying electrons to a channel in the first semiconductor. In this case, application of a low voltage between the first and second electrodes can cause an electron to be injected into the quantum box from the channel in the first semiconductor and application of light can cause the electron to be emitted from the quantum box into the channel in the first semiconductor.

The semiconductor device may further include a third electrode for producing an electric field between the channel in the first semiconductor and the quantum box. In this case, application of a low positive voltage to the third electrode can cause an electron to be injected into the quantum box from the channel and application of a low reverse voltage to the third electrode can cause the electron to be emitted from the quantum box to the channel.

Particularly, it is preferred that the capacitance between the channel in the first semiconductor and the quantum box is smaller than about $10^{-16}$ F. This enables the semiconductor device to operate at a temperature of 1K or higher.

The first semiconductor may be composed of silicon, the second semiconductor or insulator may be composed of an oxide film, and the quantum box may include a silicon, germanium or metal fine particle.

A semiconductor device according to another aspect of the present invention includes a channel region in which electrons drift, and a quantum box provided in the vicinity of the channel region with a potential barrier interposed therebetween, for accumulating an electron.

A method of manufacturing a semiconductor device according to still another aspect of the present invention includes the steps of forming a semiconductor layer or a semiconductor substrate including a channel region in which electrons drift, and forming a quantum box for accumulating an electron in the vicinity of the channel region through a potential barrier.

According to the present invention, as has been described above, a semiconductor device can be obtained which can operate as an element for a memory or an element for a digital logic circuit on the basis of existence/absence of accumulation of an electron in the quantum box. A thick potential barrier is not needed to stably accumulate an electron in the quantum box, so that it can operate at a low voltage with small power consumption and a long life. Furthermore, as the junction capacitance between the quantum box and the channel is extremely small, it can operate at high speed and can be applied to a logic circuit. Moreover, its simple structure facilitates higher integration and enables planarization. Particularly, if a known self-organizing formation dot is used to form the quantum box, no special fine processing technic and special crystal growing technic are needed. Also, by reducing the size of the quantum box, it can operate at the room temperature. Furthermore, since it operates with voltage and current in the same way as conventional transistors, the circuit design is easy.

These and other objects, features, aspects and advantages of the present invention will become more apparent from the following detailed description of the present invention when taken in conjunction with the accompanying drawings.

DESCRIPTION OF THE PREFERRED EMBODIMENTS (1) First Embodiment

Figure 1:
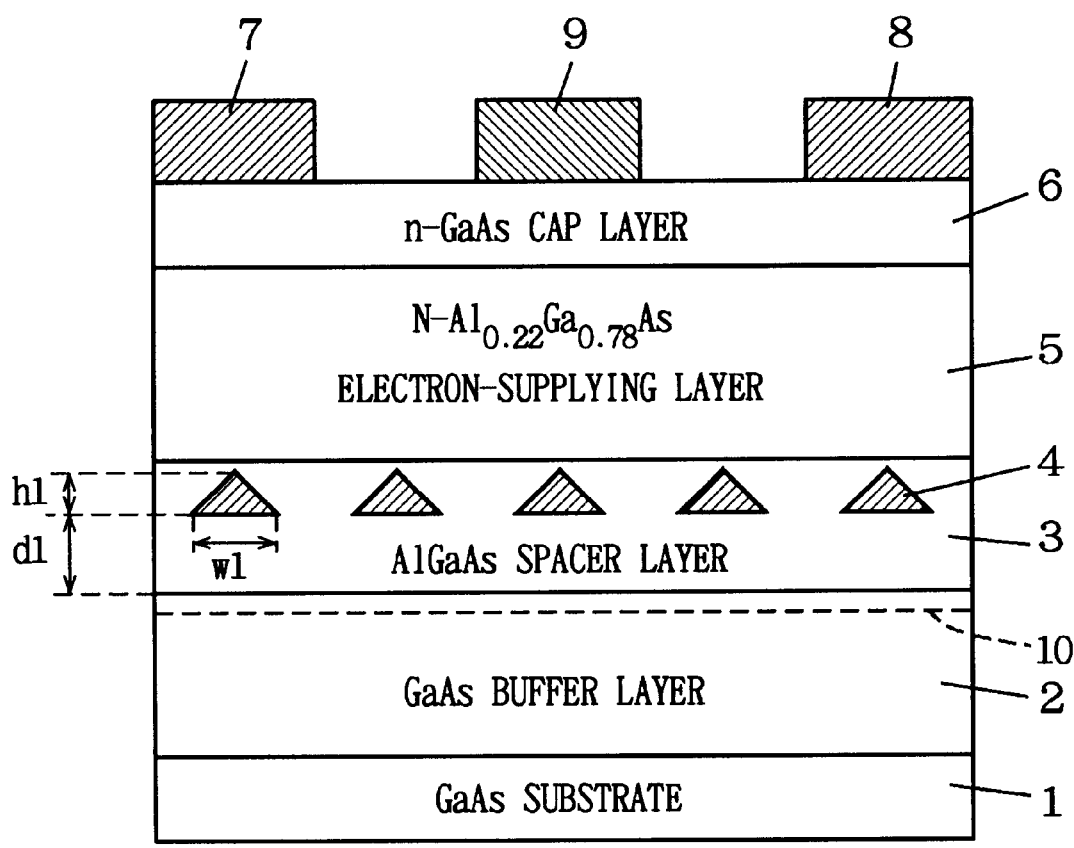
FIG. 1 is a schematic sectional view showing the structure of a semiconductor device according to a first embodiment of the present invention.

FIG. 1 is a schematic sectional view showing the structure of a modulation dope type semiconductor device according to a first embodiment.

In FIG. 1, an undoped GaAs buffer layer 2 with a thickness of 8000 Å and an undoped $Al_{0.22}Ga_{0.78}As$ spacer layer 3 with a thickness of 190 Å are formed in order on a GaAs substrate 1. Undoped InAs quantum boxes 4 are formed in the $Al_{0.22}Ga_{0.78}As$ spacer layer 3. The size w1 of the InAs quantum box 4 is about 150 Å and the height h1 is about 40 Å. The distance d1 between the InAs quantum box 4 and the GaAs buffer layer 2 is 150 Å. The number of the InAs quantum boxes 4 is at least one.

Formation of the InAs quantum boxes can be accomplished by supplying InAs of 2 monolayers or more on a GaAs layer or an AlGaAs layer. Using the molecular-beam epitaxy (MBE) method causes formation of dots with size of about 150 Å and height of about 40 Å in a self-organizing manner, for example.

An $N-Al_{0.22}Ga_{0.78}As$ electron-supplying layer 5 with a thickness of 250 Å and an n-GaAs cap layer 6 with a thickness of 100 Å are formed in order on the $Al_{0.22}Ga_{0.78}As$ spacer layer 3. Now, "n" indicates an n-type semiconductor having a small forbidden band and "N" indicates an n-type semiconductor having a large forbidden band. The $N-Al_{0.22}Ga_{0.78}As$ electron-supplying layer 5 and the n-GaAs cap layer 6 are doped with donor of concentration of $2 \times 10^{18}$ cm$^{-3}$, such as Si, respectively.

In the GaAs buffer layer 2, two-dimensional electron gas serving as a channel exists in the vicinity of the interface with the $Al_{0.22}Ga_{0.78}As$ spacer layer 3.

A source electrode 7 and a drain electrode 8 are formed at a certain interval on the n-GaAs cap layer 6 and a gate electrode 9 is formed between the source electrode 7 and the drain electrode 8.

Figure 2:
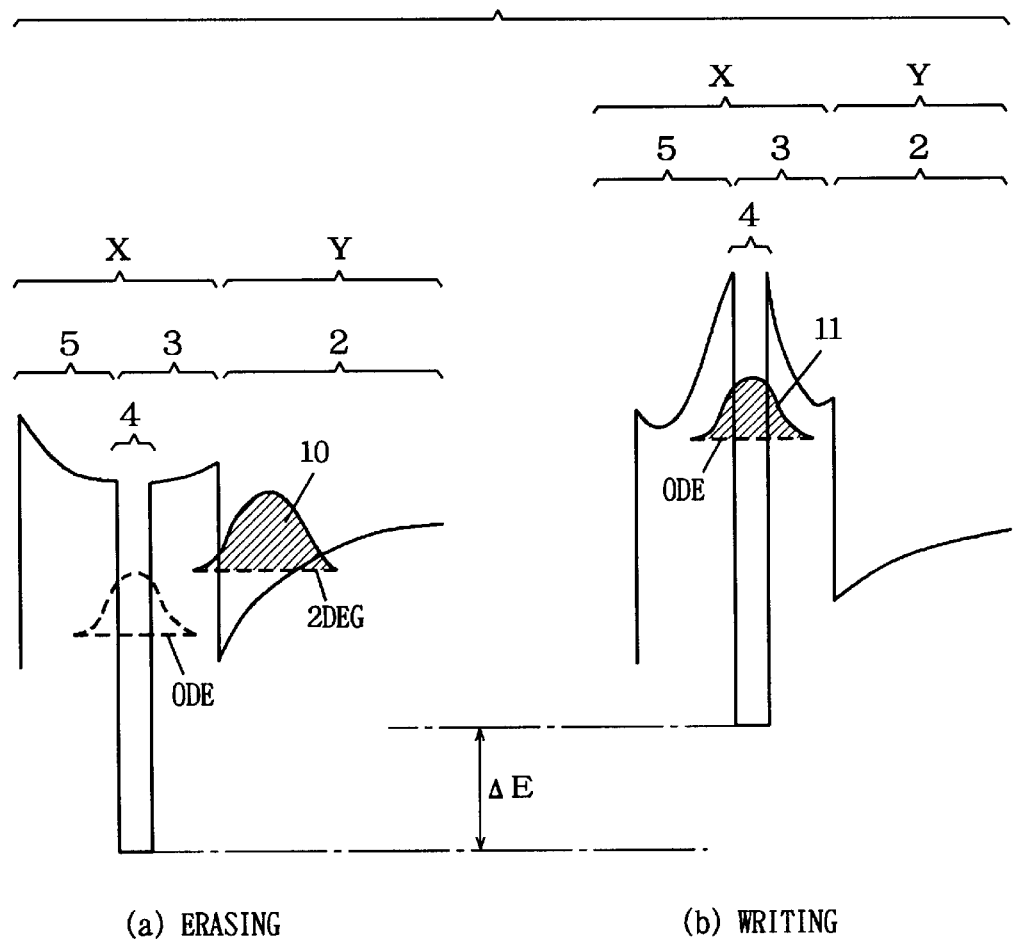
FIG. 2 is an energy band diagram in erasing and writing of the semiconductor device according to the first embodiment.

FIG. 2 is an energy band diagram showing erasing and writing of the semiconductor device of FIG. 1.

As shown in FIG. 2, the $Al_{0.22}Ga_{0.78}As$ spacer layer 3 and the $N-Al_{0.22}Ga_{0.78}As$ electron-supplying layer 5 correspond to the first semiconductor X having a large forbidden bandgap and the GaAs buffer layer 2 corresponds to the second semiconductor Y having a small forbidden bandgap, and the InAs quantum boxes 4 are formed in the first semiconductor X. The quantum level of the two-dimensional electron gas (2 DEG) is formed in the vicinity of the interface with the $Al_{0.22}Ga_{0.78}As$ spacer layer 3 in the GaAs buffer layer 2 and the quantum level of the zero-dimensional electrons (ODE) is formed in the InAs quantum box 4.

As shown in FIG. 2(a), the two-dimensional electron gas 10 exists at the quantum level of the two-dimensional electron gas (2 DEG) when erasing. When writing, a voltage of about 1 V is applied between the source electrode 7 and the drain electrode 8, or a positive voltage not more than 0.8 V is applied to the gate electrode 9. Then, the energy of electrons becomes larger than the Coulomb energy necessary to accumulate electrons in the InAs quantum box 4, and the electrons are injected into the InAs quantum box 4 by tunneling from the quantum level of the two-dimensional electron gas (2 DEG).

Accordingly, as shown in FIG. 2(b), electrons 11 are accumulated at the quantum level of the zero-dimensional electrons (0 DE) and the internal potential energy of the InAs quantum box 4 increases by ΔE. As a result, electrons are stably accumulated in the InAs quantum box 4. In this case, electrons in the channel in the GaAs buffer layer 2 are subject to the Rutherford scattering by electrons in the InAs quantum box 4, and a part of electrons move to the InAs quantum box 4 and electrons in the channel decrease, so that the resistance of the channel increases to about four times.

Figure 3:
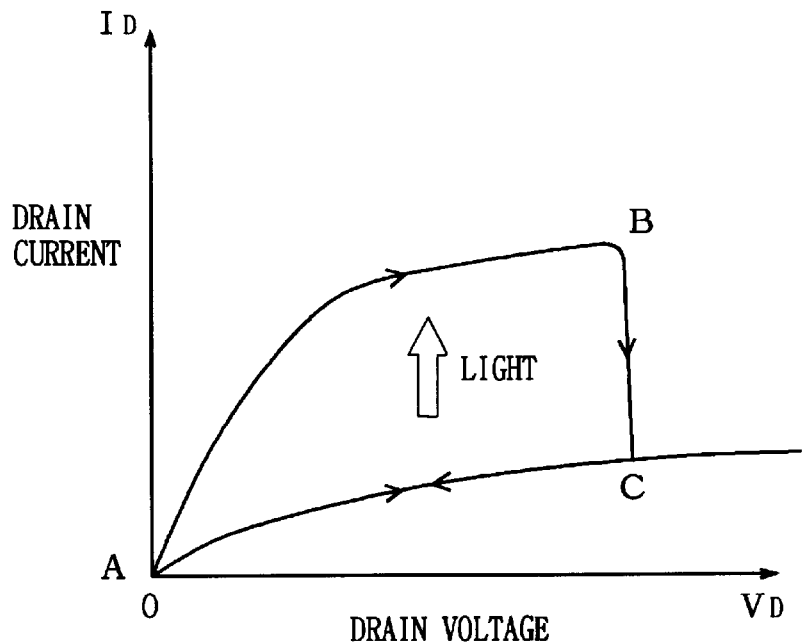
FIG. 3 is a diagram showing the static characteristics of the semiconductor device according to the first embodiment when using no gate electrode.

FIG. 3 is a diagram showing the static characteristic of the semiconductor device of FIG. 1 which does not use the gate electrode 9. When the source electrode 7 is set to the ground potential and a drain voltage $V_D$ is applied to the drain electrode 8, then drain current $I_D$ flows to the drain electrode 8 through the channel in the GaAs buffer layer 2 from the source electrode 7.

As shown in FIG. 3, when the drain voltage $V_D$ is increased, the drain current $I_D$ also increases, which rapidly decreases at the point B with a certain drain voltage to reach the point C. Thus, it goes into a writing state, and the drain current $I_D$ shows the characteristic from the point A to the point C. Accordingly, the drain current $I_D$ hardly flows even if the drain voltage $V_D$ is applied. Subsequently, if light is applied, the drain current $I_D$ returns to the characteristic from the point A to the point B, ant it enters an erasing state.

Figure 4:
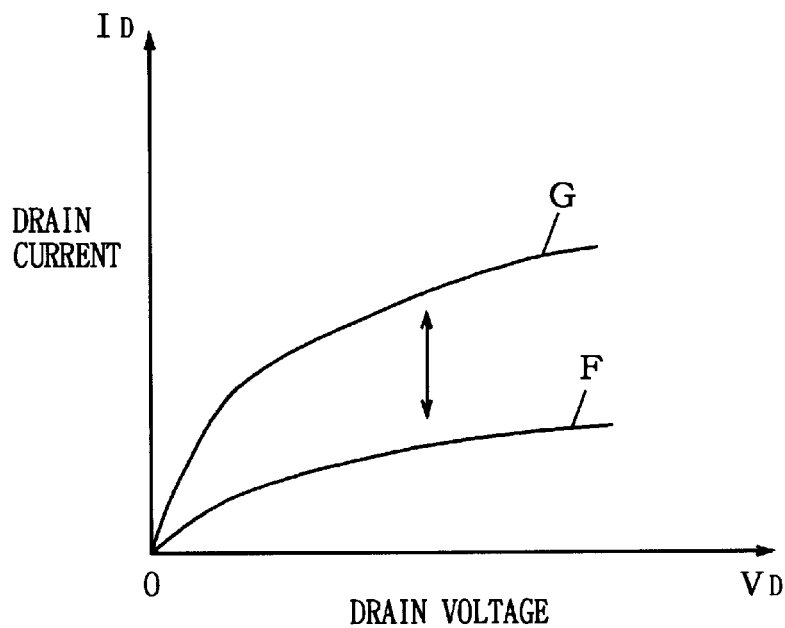
FIG. 4 is a diagram showing the static characteristics of the semiconductor device of the first embodiment when using a gate electrode.

FIG. 4 is a diagram showing the static characteristic of the semiconductor device of FIG. 1 when using the gate electrode 9. As shown in FIG. 4, if a low positive gate voltage $V_G$ not more than 0.8 V is applied to the gate electrode 9, the drain current $I_D$ shows the characteristic of the line F, and the drain current $I_D$ hardly flows even if the drain voltage $V_D$ is applied, and it goes into a writing state. If a negative gate voltage $V_G$ is applied to the gate electrode 9, the drain current $I_D$ shows the characteristic of the line G, the drain current $I_D$ increases as the drain voltage $V_D$ increases, and it goes into an erasing state.

As describe above, the semiconductor device of the first embodiment operates as a non-volatile memory element.

(2) Second Embodiment

Figure 5:
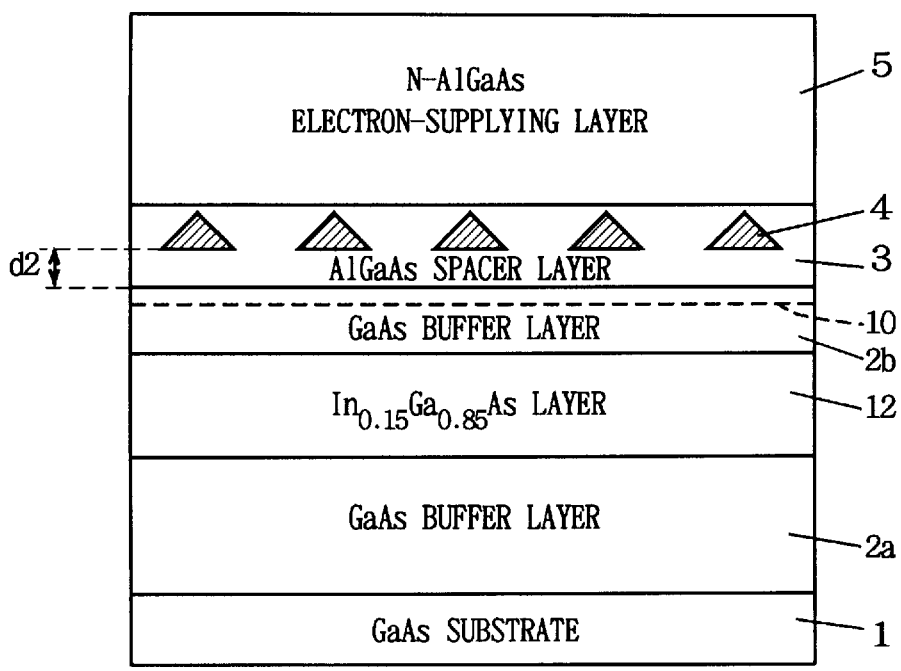
FIG. 5 is a schematic sectional view showing the structure of a main part of a semiconductor device according to a second embodiment of the present invention.

FIG. 5 is a schematic sectional view showing the structure of a main part of a modulation dope type semiconductor device according to a second embodiment. In FIG. 5, the n-GaAs cap layer 6, the source electrode 7, the drain electrode 8 and the gate electrode 9 in FIG. 1 are not shown.

An undoped GaAs buffer layer 2a with a thickness of 8000 Å, an undoped $In_{0.15}Ga_{0.85}As$ layer 12 with a thickness of 150 Å and an undoped GaAs buffer layer 2b with a thickness of 100 Å are formed in order on the GaAs substrate 1. Furthermore, an undoped $Al_{0.22}Ga_{0.78}As$ spacer layer 3 with a thickness of 90 Å is formed on the GaAs buffer layer 2b, and undoped InAs quantum boxes 4 are formed in the $Al_{0.22}Ga_{0.78}As$ spacer layer 3. The size of the InAs quantum box 4 is about 150 Å and the height is about 40 Å. The distance d2 between the InAs quantum box 4 and the GaAs buffer layer 2b is 50 Å. An N-AlGaAs electron-supplying layer 5 with a thickness of 300 Å is formed on the $Al_{0.22}Ga_{0.78}As$ spacer layer 3.

Figure 6:
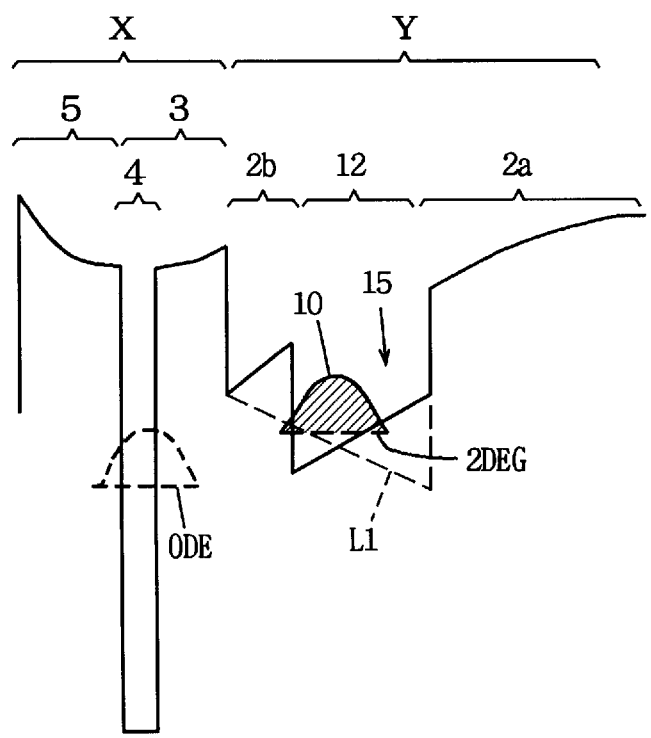
FIG. 6 is an energy band diagram in erasing of the semiconductor device according to the second embodiment.

FIG. 6 is an energy band diagram in erasing of the semiconductor device of FIG. 5.

As shown in FIG. 6, the $Al_{0.22}Ga_{0.78}As$ spacer layer 3 and the N-AlGaAs electron-supplying layer 5 correspond to the first semiconductor X having a large forbidden bandgap and the GaAs buffer layers 2a and 2b correspond to the second semiconductor Y having a small forbidden bandgap, and the InAs quantum boxes 4 are formed in the first semiconductor X. The $Al_{0.22}Ga_{0.78}As$ layer 12 having a forbidden bandgap smaller than that of the second semiconductor Y is formed in the second semiconductor Y.

Thus, a well 15 is formed in the second semiconductor Y and the two-dimensional electron gas 10 spreads also into the well 15. As a result, the distance between the channel formed of the two-dimensional electron gas 10 and the InAs quantum box 4 becomes longer, and the junction capacitance between the InAs quantum box 4 and the channel becomes smaller. Accordingly, the distance between the InAs quantum box 4 and the GaAs buffer layer 2b can be shortened.

Also, the two-dimensional electron gas 10 spreading into the well 15 increases concentration of electrons accumulated in the channel, which reduces resistance of the channel. This increases the current flowing in the channel and the ON/OFF ratio (logic amplitude) of the current can be increased, which facilitates logical design.

In the second semiconductor Y, as shown by the broken line L1, varying the forbidden bandgap in a graded manner will produce the same effects.

(3) Third Embodiment

Figure 7:
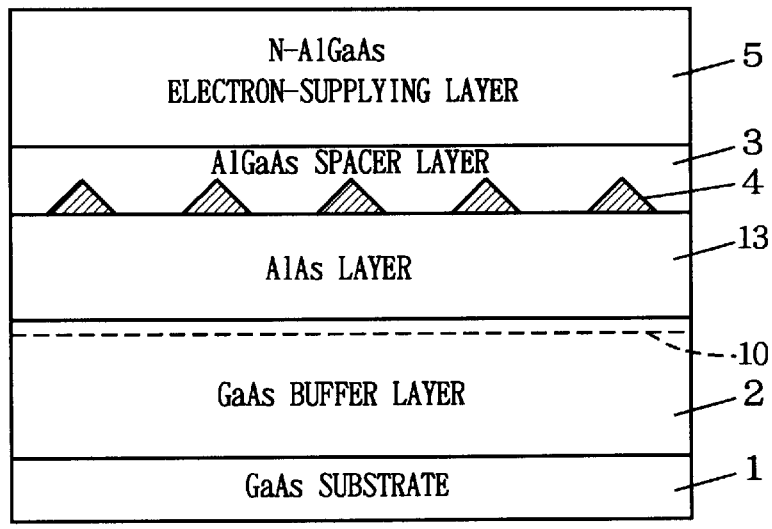
FIG. 7 is a schematic sectional view showing the structure of a main part of a semiconductor device according to a third embodiment of the present invention.

FIG. 7 is a schematic sectional view showing the structure of a main part of a modulation dope type semiconductor device according to a third embodiment. In FIG. 7, the n-GaAs cap layer 6, the source electrode 7, the drain electrode 8 and the gate electrode 9 in FIG. 1 are not shown, either.

In FIG. 7, an undoped GaAs buffer layer 2 with a thickness of 8000 Å and an undoped AlAs layer 13 with a thickness of 150 Å are formed in order on the GaAs substrate 1. An undoped $Al_{0.22}Ga_{0.78}As$ spacer layer 3 with a thickness of 40 Å is formed on the AlAs layer 13 and undoped InAs quantum boxes 4 are formed in the $Al_{0.22}Ga_{0.78}As$ spacer layer 3. The size of the InAs quantum box 4 is about 150 Å and the height is about 40 Å. An N-AlGaAs electron-supplying layer 5 with a thickness of 300 Å is formed on the $Al_{0.22}Ga_{0.78}As$ spacer layer 3.

Figure 8:
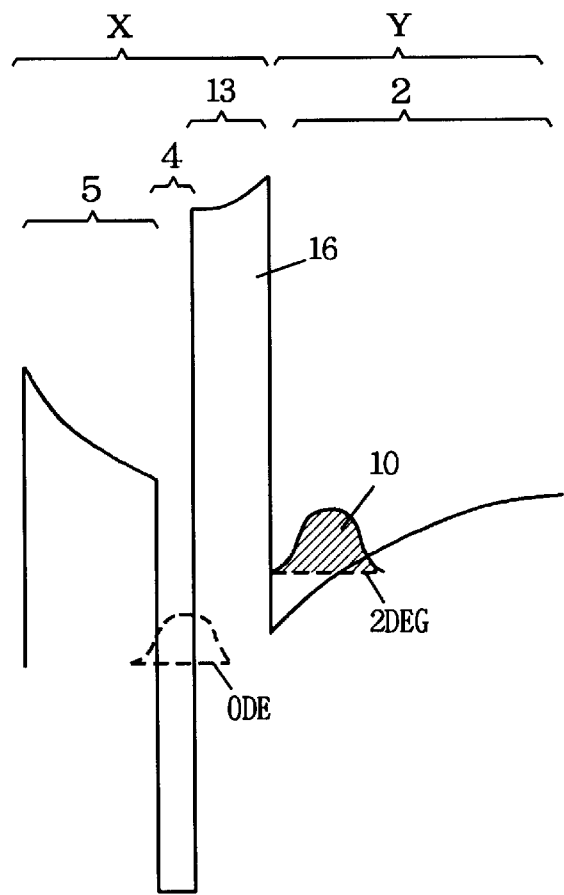
FIG. 8 is an energy band diagram in erasing of the semiconductor device according to the third embodiment.

FIG. 8 shows an energy band diagram in erasing of the semiconductor device of FIG. 7.

As shown in FIG. 8, the N-AlGaAs electron-supplying layer 5 corresponds to the first -semiconductor X having a large forbidden bandgap, the GaAs buffer layer 2 corresponds to the second semiconductor Y having a small forbidden bandgap, and the InAs quantum boxes 4 are formed in the first semiconductor X. In the first semiconductor X, the AlAs layer 13 having a forbidden bandgap larger than that of the first semiconductor X is formed between the interface on the second semiconductor Y side and the InAs quantum boxes 4.

This forms a barrier 16 between the quantum level of the two-dimensional electron gas (2 DEG) and the quantum level of the zero-dimensional electrons (0 DE) and transition by tunneling of electrons from the channel formed of the two-dimensional electron gas 10 into the InAs quantum box 4 is prevented.

(4) Fourth Embodiment

Figure 9:
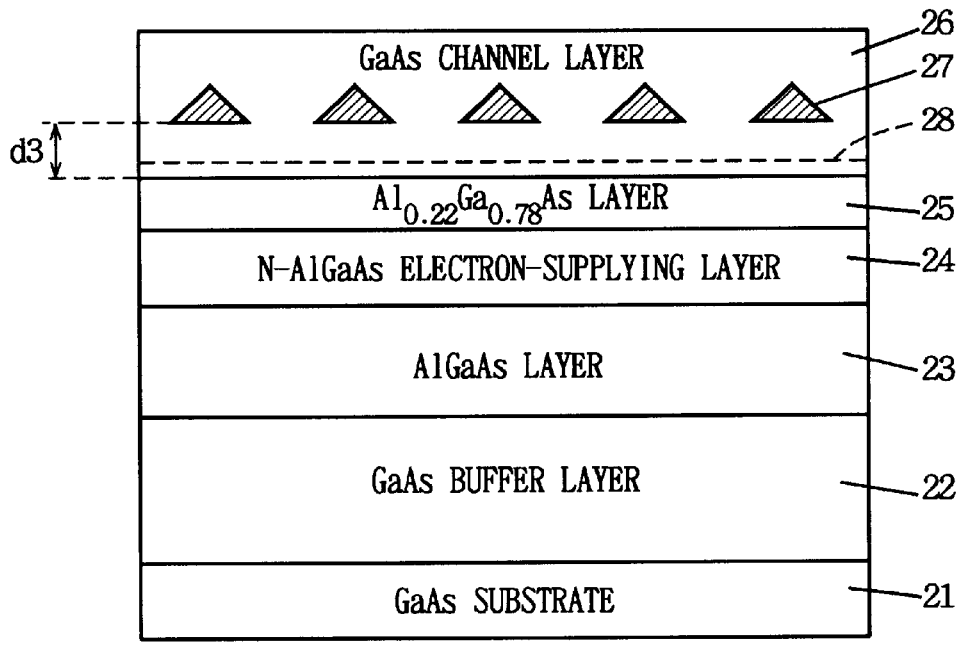
FIG. 9 is a schematic sectional view showing the structure of a main part of a semiconductor device according to a fourth embodiment the present invention.

FIG. 9 is a schematic sectional view showing the structure of a main part of a modulation dope type semiconductor device according to a fourth embodiment. The n-GaAs cap layer 6, the source electrode 7, the drain electrode 8 and the gate electrode 9 of FIG. 1 are not shown in FIG. 9, either.

In FIG. 9, an undoped GaAs buffer layer 22 with a thickness of 8000 Å, an undoped AlGaAs layer 23 with a thickness of 500 Å, and an N-AlGaAs electron-supplying layer 24 with a thickness of 300 Å are formed in order on a GaAs substrate 21. The N-AlGaAs electron-supplying layer 24 is doped with donor at concentration $2 \times 10^{18}$ $cm^{-3}$.

An undoped $Al_{0.22}Ga_{0.78}As$ layer 25 with a thickness of 20 Å, and an undoped GaAs channel layer 26 with a thickness of 500 Å are formed in order on the N-AlGaAs electron-supplying layer 24, and undoped InAs quantum boxes 27 are formed in the GaAs channel layer 26. The size of the InAs quantum box 27 is about 150 Å, and the height is about 40 Å. The distance d3 between the InAs quantum box 27 and the $Al_{0.22}Ga_{0.78}As$ layer 25 is 200 Å.

In the GaAs channel layer 26, two-dimensional electron gas 28 serving as a channel exists in the vicinity of the interface with the $Al_{0.22}Ga_{0.78}As$ layer 25.

Figure 10:
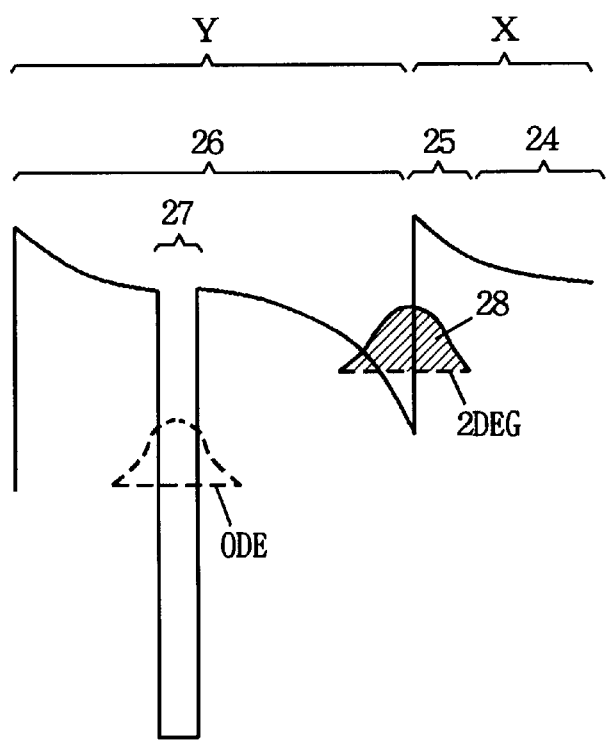
FIG. 10 is an energy band diagram in erasing of the semiconductor device according to the fourth embodiment.

FIG. 10 is an energy band diagram in erasing of the semiconductor device of FIG. 9.

As shown in FIG. 10, the N-AlGaAs electron-supplying layer 24 and the $Al_{0.22}Ga_{0.78}As$ layer 25 correspond to the first semiconductor X having a large forbidden bandgap, the GaAs channel layer 26 corresponds to the second semiconductor Y having a small forbidden bandgap, and the InAs quantum boxes 27 are formed in the second semiconductor Y. The quantum level of the two-dimensional electron gas (2 DEG) exists in the vicinity of the interface with the first semiconductor X in the second semiconductor Y and the quantum level of the zero-dimensional electrons (0 DE) exists in the InAs quantum box 27.

In erasing, the two-dimensional electron gas 28 is accumulated at the quantum level of the two-dimensional electron gas (2 DEG). In writing, electrons are injected into the InAs quantum boxes 27 from the quantum level of the two-dimensional electron gas (2 DEG) by tunneling.

(5) Fifth Embodiment

Figure 11:
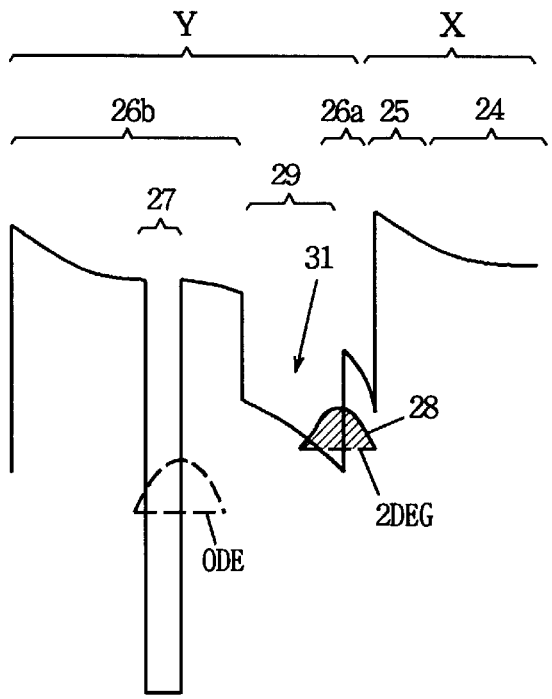
FIG. 11 is an energy band diagram in erasing of a semiconductor device according to a fifth embodiment of the present invention.

FIG. 11 is an energy band diagram in erasing of a modulation dope type semiconductor device according to a fifth embodiment. The semiconductor device of this embodiment has the same structure as that of the semiconductor device of the fourth embodiment except the following point.

As shown in FIG. 11, the N-AlGaAs electron-supplying layer 24 and the $Al_{0.22}Ga_{0.78}As$ layer 25 correspond to the first semiconductor X having a large forbidden bandgap, the GaAs channel layers 26a and 26b correspond to the second semiconductor Y having a small forbidden bandgap, and InAs quantum boxes 27 are provided in the second semiconductor Y. In the second semiconductor Y, an $In_{0.15}Ga_{0.85}As$ layer 29 having a forbidden bandgap smaller than that of the second semiconductor Y is provided between the interface on the first semiconductor X side and the InAs quantum boxes 27.

This forms a well 31 between the N-AlGaAs electron-supplying layer 24 and the InAs quantum box 27, and the two-dimensional electron gas 28 spreads into the well 31. Accordingly, concentration of electrons accumulated in the channel increases and resistance of the channel is reduced. As a result, the current flowing in the channel increases and then the ON/OFF ratio (logical amplitude) of the current can be made large, which facilitates logical design.

(6) Sixth Embodiment

Figure 12:
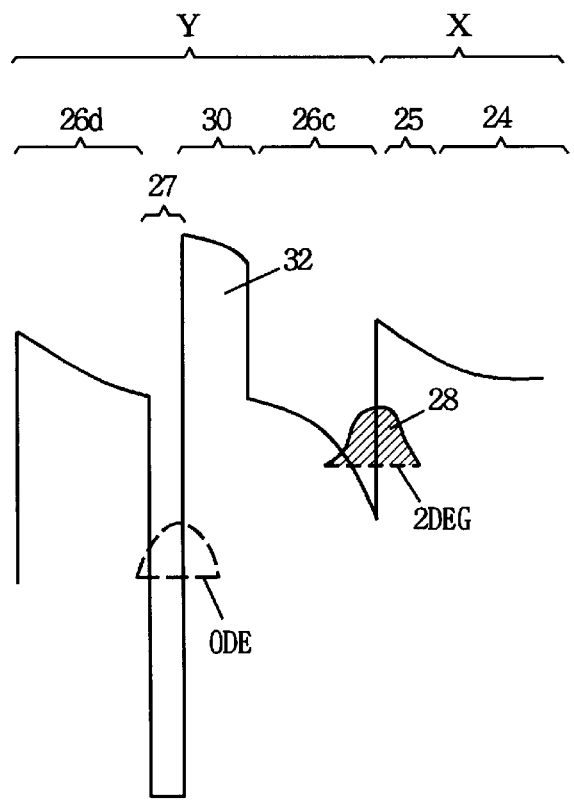
FIG. 12 is an energy band diagram in erasing of a semiconductor device according to a sixth embodiment of the present invention.

FIG. 12 is an energy band diagram in erasing of a modulation dope type semiconductor device according to a sixth embodiment. The semiconductor device of this embodiment has the same structure as that of the fourth embodiment except the following point.

As shown in FIG. 12, the N-AlGaAs electron-supplying layer 24 and the $Al_{0.22}Ga_{0.78}As$ layer 25 correspond to the first semiconductor X having a large forbidden bandgap, the GaAs channel layers 26c and 26d correspond to the second semiconductor Y having a small forbidden bandgap, and InAs quantum boxes 27 are provided in the second semiconductor Y. In the second semiconductor Y, an AlAs layer 30 having a forbidden bandgap larger than that of the second semiconductor Y is provided between the interface on the first semiconductor X side and the InAs quantum boxes 27.

Thus, a barrier 32 is formed between the quantum level of the two-dimensional electron gas (2 DEG) and the quantum level of the zero-dimensional electrons (0 DE), and transition by tunneling of electrons from the channel formed of the two-dimensional electron gas 28 into the InAs quantum boxes 27 can be prevented.

(7) Seventh Embodiment

Figure 13:
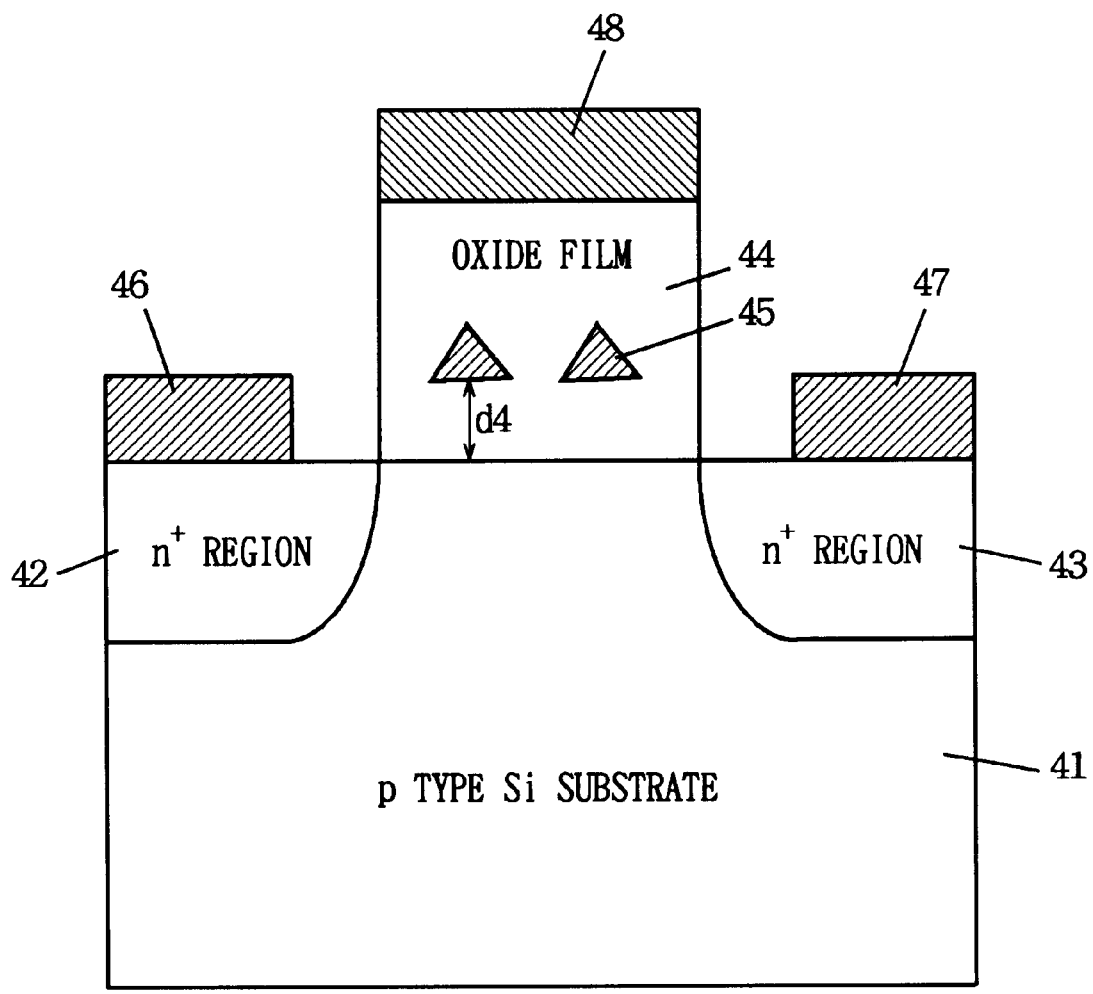
FIG. 13 is a schematic sectional view showing the structure of a semiconductor device according to a seventh embodiment of the present invention.

FIG. 13 is a schematic sectional view showing the structure of an MOS semiconductor device according to a seventh embodiment.

In FIG. 13, n$^+$ regions 42 and 43 are formed at a certain interval in the surface of a p-type Si substrate 41. An oxide film 44 composed of $SiO_2$ is formed on the region between the n$^+$ regions 42 and 43 and Si quantum boxes 45 are formed in the oxide film 44. The Si quantum box 45 is composed of a Si fine particle with a size of about 30–80 Å. The distance d4 between the Si quantum box 45 and the p-type Si substrate 41 is 100 Å or below.

As a method of forming the Si quantum boxes 45, a method of applying the high-frequency sputtering to a target, a Si single crystal placed on a $SiO_2$ film, to form Si fine particles of about 30–80 Å in the $SiO_2$ film, or a method of applying the plasma CVD method using silane ($SiH_4$) gas to form Si fine particles of about 30–60 Å on a $SiO_2$ film and further depositing $SiO_2$ on the $SiO_2$ film is used.

A source electrode 46 and a drain electrode 47 are formed on the n$^+$ regions 42 and 43, respectively, and a gate electrode 48 is formed on the oxide film 44. When the source electrode 46 is set to the ground potential and a predetermined drain voltage is applied to the drain electrode 47, a channel is formed between the n$^+$ regions 42 and 43.

Also in the semiconductor device of this embodiment, electrons can be accumulated into the Si quantum boxes 45 in the oxide film 44 from the channel between the n$^+$ regions 42 and 43 by applying a positive low voltage to the drain electrode 47 or the gate electrode 48.

When electrons are accumulated in the Si quantum boxes 45, a drain current hardly flows even if a drain voltage is applied between the drain electrode 47 and the source electrode 46, and it enters a writing state.

If light is applied to the oxide film 44 or a negative low voltage is applied to the gate electrode 48, the electrons in the Si quantum boxes 45 are emitted into the channel between the n$^+$ regions 42 and 43, and it enters an erasing state.

Quantum boxes composed of Ge fine particles or metal fine particles may be used in place of the Si quantum boxes 45.

(8) Eighth Embodiment

Figure 14:
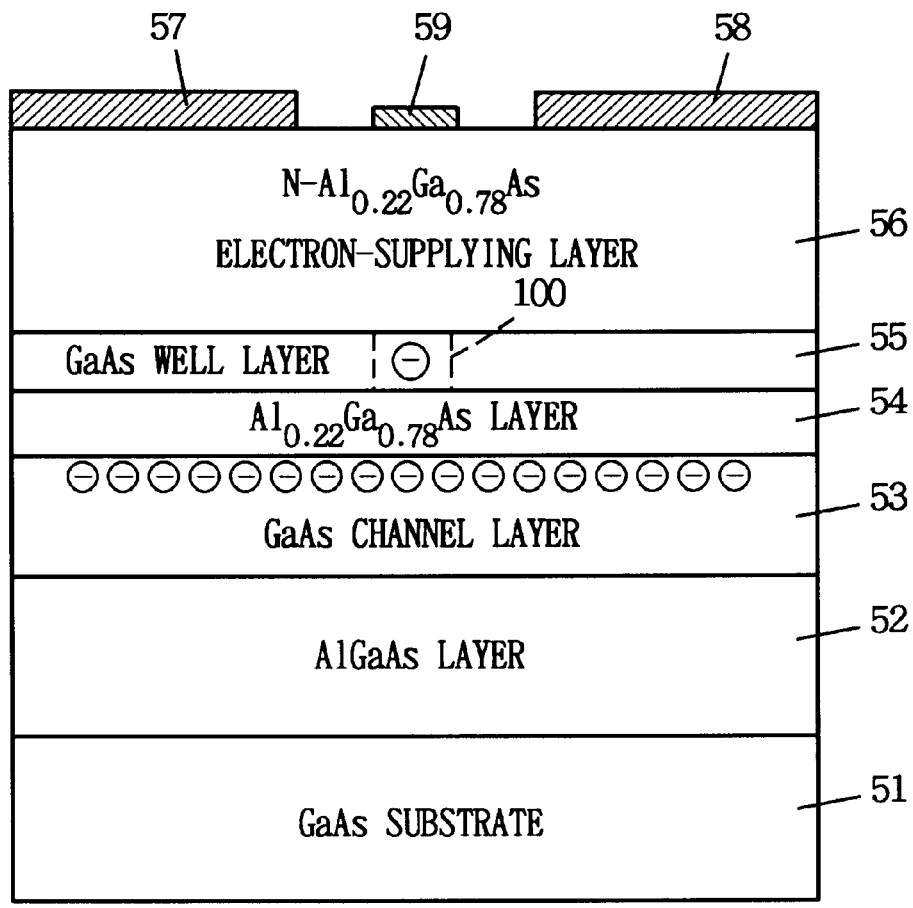
FIG. 14 is a schematic sectional view showing the structure of a semiconductor device according to an eighth embodiment of the present invention.
Figure 15:
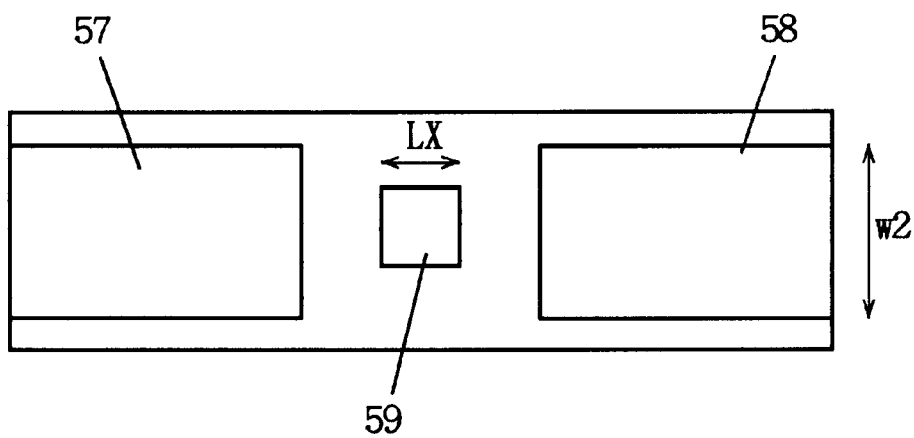
FIG. 15 is a schematic plan view of the semiconductor device according to the eighth embodiment.

FIG. 14 is a schematic sectional view showing the structure of a semiconductor device according to an eighth embodiment, and FIG. 15 is a schematic plan view of that semiconductor device.

In FIG. 14, an undoped AlGaAs layer 52 with a thickness of 500 Å, an undoped GaAs channel layer 53 with a thickness of 200 Å, and an undoped $Al_{0.22}Ga_{0.78}As$ layer 54 with a thickness of 100 Å are formed in order on a GaAs substrate 51. An undoped GaAs well layer 55 with a thickness of 100 Å, and an N-$Al_{0.22}Ga_{0.78}As$ electron-supplying layer 56 with a thickness of 500 Å are formed in order on the $Al_{0.22}Ga_{0.78}As$ layer 54. The N-$Al_{0.22}Ga_{0.78}As$ electron-supplying layer 56 is doped with donor at concentration $2\times10^{18}$ cm$^{-3}$.

A source electrode 57 and a drain electrode 58 are formed at a certain interval on the N-$Al_{0.22}Ga_{0.78}As$ electron-supplying layer 56, and a gate electrode 59 is formed between the source electrode 57 and the drain electrode 58. As shown in FIG. 15, the length LX of one side of the gate electrode 59 is shorter than 1000 Å and the width w2 of the source electrode 57 and the drain electrode 58 is formed to 1000 Å.

Figure 16:
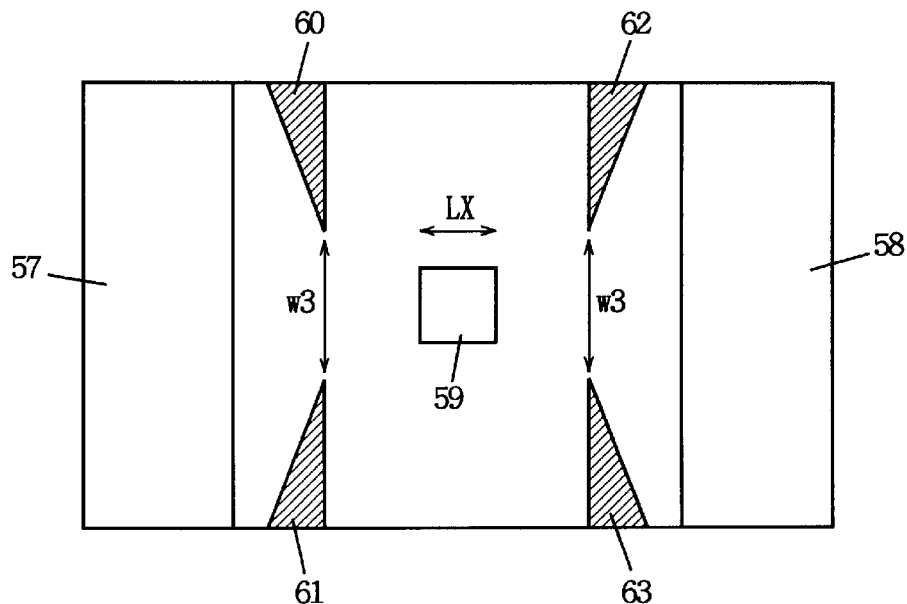
FIG. 16 is a diagram showing another example of the plane structure of the semiconductor device according to the eighth embodiment.

Instead of forming the width w2 of the source electrode 57 and the drain electrode 58 to 1000 Å, as shown in FIG. 16, potential barriers 60 and 61 may be provided between the source electrode 57 and the gate electrode 59, and potential barriers 62 and 63 may be provided between the drain electrode 58 and the gate electrode 59, with the distance w3 between the potential barriers 60 and 61 and the distance w3 between the potential barriers 62 and 63 being set to 1000 Å.

The potential barriers 60, 61, 62 and 63 are formed by increasing the resistance of the N-$Al_{0.22}Ga_{0.78}As$ electron-supplying layer 56 using the focused ion beam (FIB), or by etching the N-$Al_{0.22}Ga_{0.78}As$ electron-supplying layer 56, for example.

An undoped GaAs buffer layer with a thickness of 8000 Å may be provided instead of the AlGaAs layer 52. Or, an n-GaAs cap layer may be provided on the N-$Al_{0.22}Ga_{0.78}As$ electron-supplying layer 56.

Next, referring to FIG. 17, operation principle of the semiconductor device of this embodiment will be described.

Figure 17:
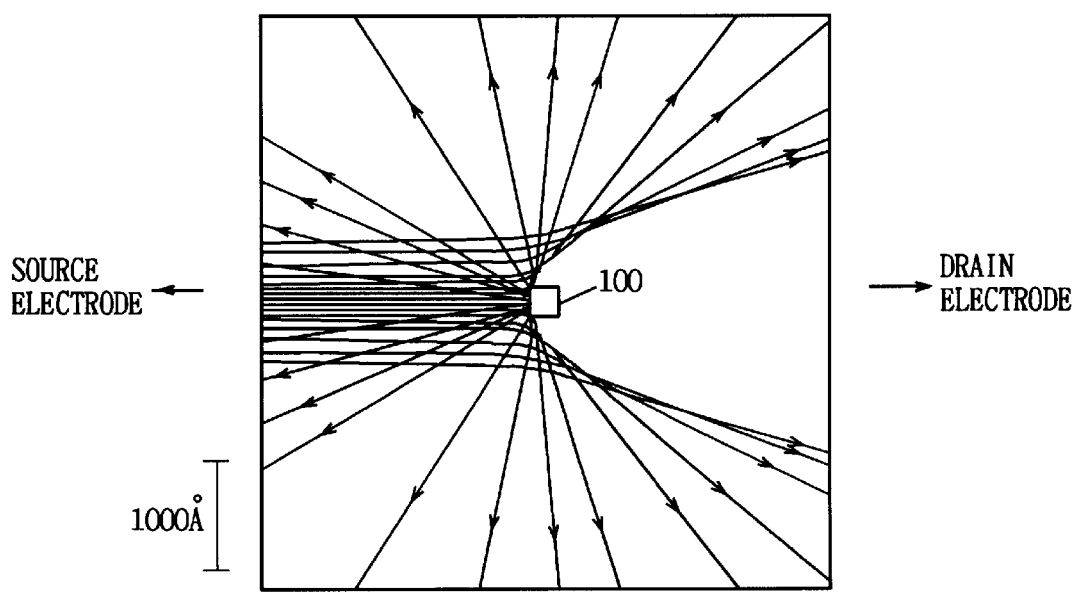
FIG. 17 is a diagram for illustrating the operation principle of the semiconductor device according to the eighth embodiment.

In FIG. 17, suppose that the length of one side of a fine junction capacitance 100 provided in the center of the channel is 200 Å and the width of the electron beam flux entering the drain electrode from the source electrode is 1000 Å. The electron velocity is $10^7$ cm/sec.

When one electron is accumulated in the fine junction capacitance 100, the electron beam flux coming from the source electrode is subject to the Rutherford scattering by the electron in the fine junction capacitance 100 and can not reach the drain electrode. When no electron is accumulated in the fine junction capacitance 100, the electron beam flux coming from the source electrode progresses straight forward to reach the drain electrode. Accordingly, presence/absence of one electron in the fine junction capacitance 100 can be detected by detecting a current value between the source electrode and the drain electrode.

A channel with high mobility is formed in the GaAs channel layer 53 of the semiconductor device of FIG. 14. If the mobility of electrons is $10^6$ cm$^2$/sec·V, the ballistic length (inelastic scattering length) of electrons is about 10 $\mu$m. In this case, the electron goes straight without undergoing the scattering in a distance corresponding to that ballistic length. Accordingly, when a voltage of about 50 mV is applied between the drain electrode 58 and the source electrode 57, the electron reaches the drain electrode 58 from the source electrode 57 if a voltage is not applied to the gate electrode 59 and a current flows between the source electrode 57 and the drain electrode 58.

Figure 18:
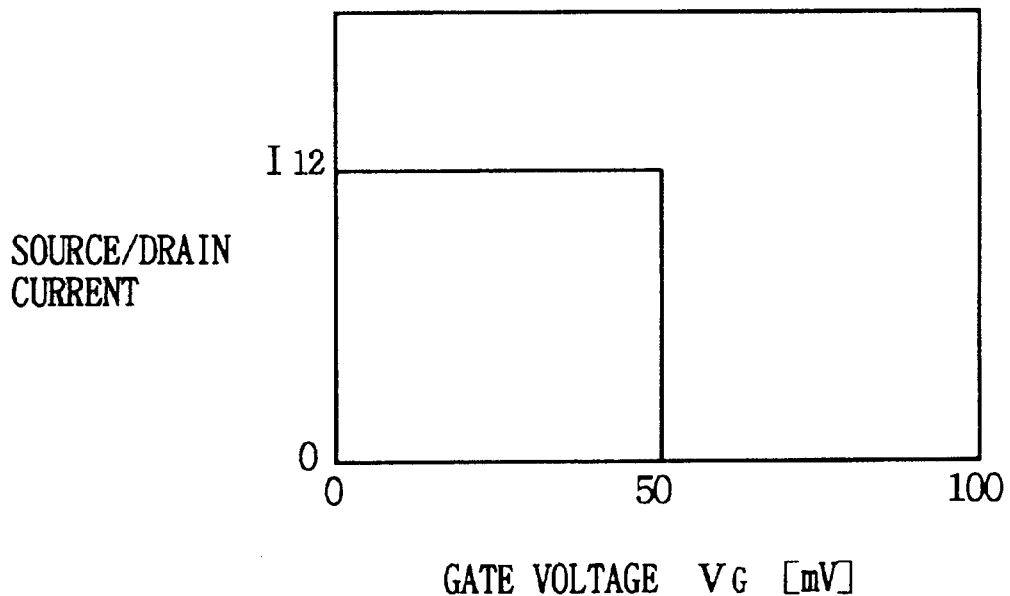
FIG. 18 is a diagram showing the relation between a current between source and drain and a gate voltage in the semiconductor device according to the eighth embodiment.
Figure 19:
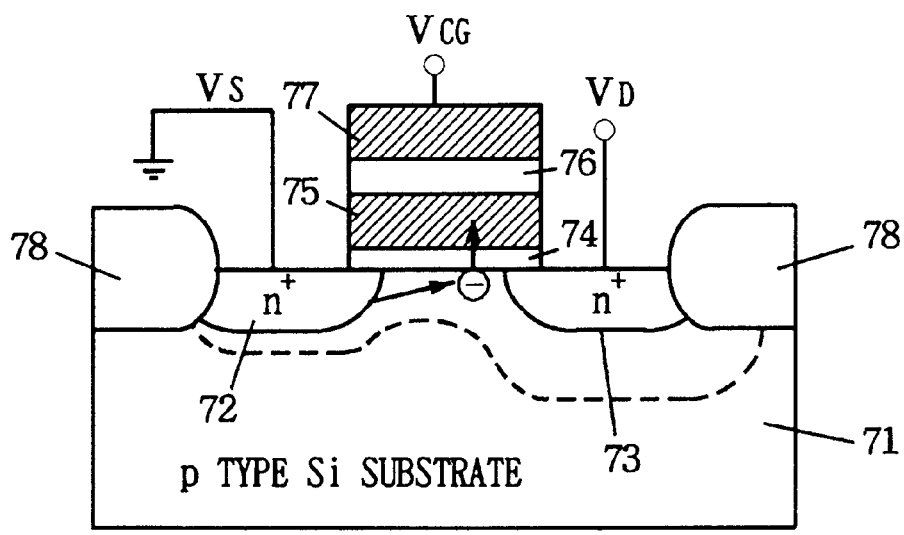
FIG. 19 is a schematic sectional view showing the structure of a conventional floating gate MOS transistor.
Figure 20:
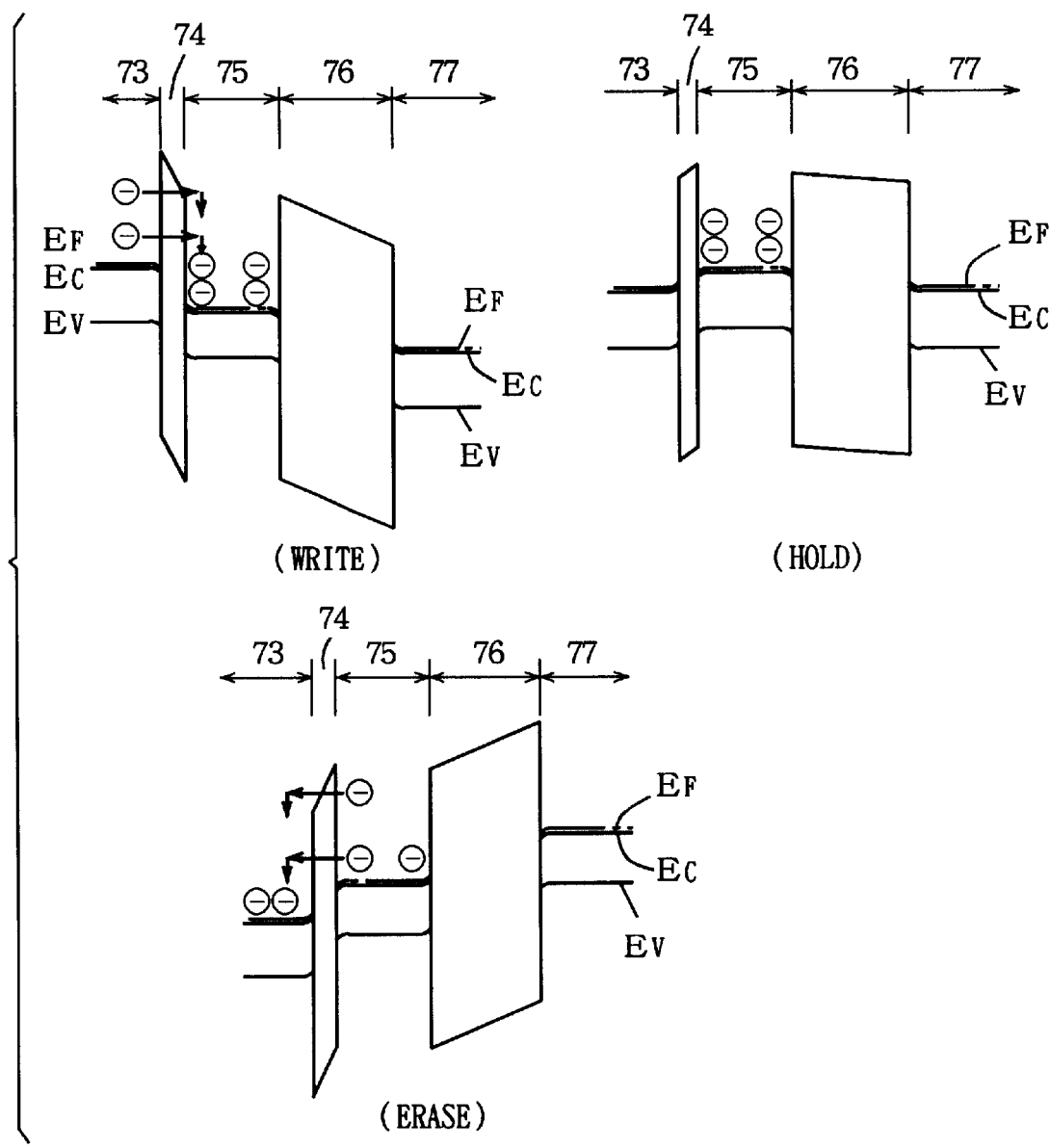
FIG. 20 is an energy band diagram in writing, holding and erasing of the floating gate MOS transistor of FIG. 19.
Figure 21:
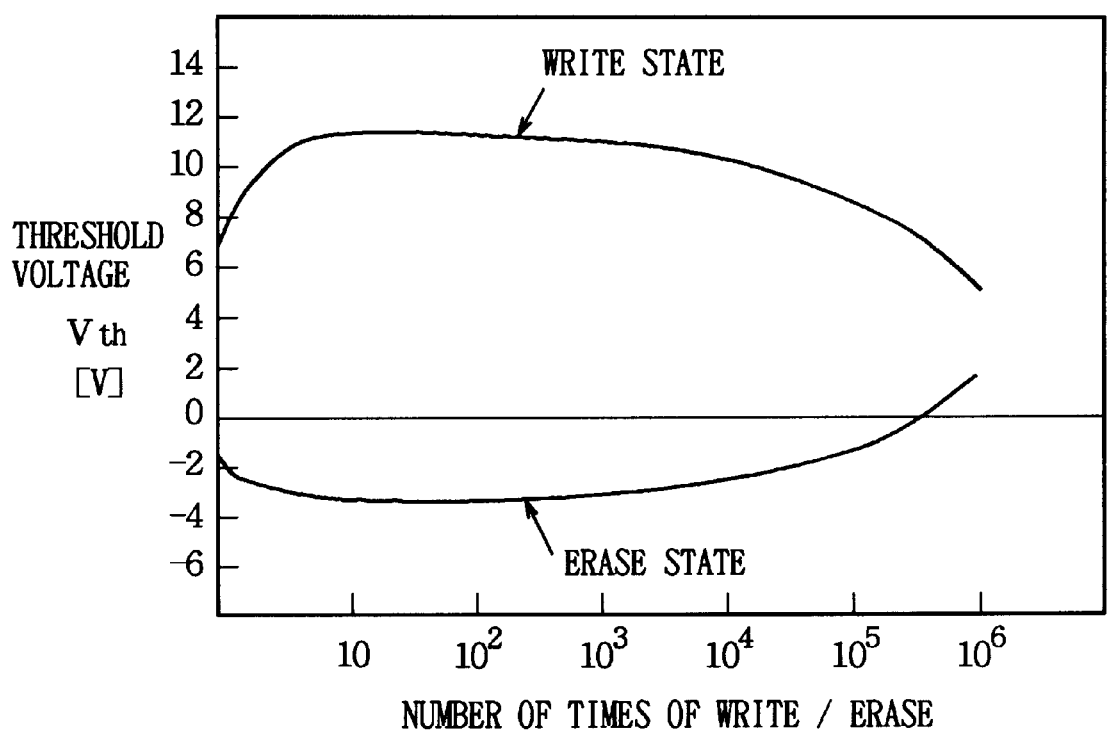
FIG. 21 is a diagram for illustrating the number of times of writing and erasing in the floating gate MOS transistor of FIG. 19.

When a positive gate voltage $V_G$ is applied to the gate electrode 59, as shown in FIG. 18, the current between the source and drain takes an almost constant value $I_{12}$ and does not change when the gate voltage $V_G$ does not reach about 50 mV. When the gate voltage $V_G$ exceeds 50 mV, one electron is accumulated by the SET phenomenon into the fine junction capacitance 100 in the GaAs well layer 55 under the gate electrode 59.

Thus, the electrons supplied to the GaAs channel layer 53 from the source electrode 57 undergo the Rutherford scattering by the Coulomb potential of the electron in the fine junction capacitance 100 and can not reach the drain electrode 58. Hence, as shown in FIG. 18, the current between source and drain becomes almost zero. In this way, the semiconductor device of this embodiment digitally operates by applying a fine voltage to the gate electrode 59.

If the length LX of one side of the gate electrode 59 is 1000 Å or below, the semiconductor device of this embodiment normally operates at a temperature of 10 K or below, and it normally operates at a room temperature if the length LX of one side of the gate electrode 59 is formed 120 Å and the width w2 of the source electrode 57 and the drain electrode 58 is formed about 200 Å.

(9) Another Modified Example

As the semiconductor having a large forbidden bandgap, InAlAs, InAlGaAs, GaAsP, AlGaAsP, or the like may be used in place of AlGaAs. Also, as the semiconductor having a small forbidden bandgap, InGaAs, InP, or the like may be used in place of GaAs.

Furthermore, as a material of the quantum box, InGaAs, GaSb, InSb, or the like may be used in place of InAs. Also, in place of the GaAs substrate, an InP substrate, or the like may be used.

While the invention has been described in detail, the foregoing description is in all aspects illustrative and not restrictive. It is understood that numerous other modifications and variations can be devised without departing from the scope of the invention.

We claim:

1. A semiconductor device, comprising:
a channel region in which electrons drift; and
a quantum box provided in a position separated from said channel region, with a potential barrier interposed therebetween, for accumulating an electron, there being no potential barrier in said channel region resulting from said quantum box.

2. The semiconductor device according to claim 1, further comprising first and second electrodes for supplying electrons to said channel region.

3. The semiconductor device according to claim 2, further comprising a third electrode for providing an electric field between said channel region and said quantum box.

4. A semiconductor device as in claim 1 wherein said channel region is formed of a two-dimensional electron gas.

5. A semiconductor device as in claim 1 wherein said device has a first state in which an electron is accumulated in said quantum box and a second state in which no electron is accumulated in said quantum box, wherein when the magnitude of the energy of the electron drifting in said channel region becomes greater than the energy for accumulating an electron in said quantum box in said second state, said device is switched to said first state.

6. A semiconductor device, comprising
a hetero structure including a first semiconductor including a layer doped with impurity and an undoped second semiconductor having a forbidden bandgap smaller than a forbidden bandgap of said first semiconductor, and
a quantum box provided in said first semiconductor for accumulating an electron;
said quantum box including a semiconductor having a forbidden bandgap smaller than the forbidden bandgap of said first semiconductor, said second semiconductor has a channel region therein in which electrons drift, there being no potential barrier in said channel region resulting from said quantum box.

7. The semiconductor device according to claim 6, wherein said first semiconductor includes an undoped layer between said impurity-doped layer and said second semiconductor.

8. The semiconductor device according to claim 6, further comprising first and second electrodes for supplying electrons from a side of said first semiconductor to a channel formed in said second semiconductor.

9. The semiconductor device according to claim 8, further comprising a third electrode for producing an electric field between said channel in said second semiconductor and said quantum box.

10. The semiconductor device according to claim 6, wherein capacitance between a channel formed in said second semiconductor and said quantum box is smaller than about $10^{-16}$ F.

11. The semiconductor device according to claim 6, further comprising a third semiconductor provided adjacent to a channel formed in said second semiconductor and having a forbidden bandgap smaller than the forbidden bandgap of said second semiconductor.

12. The semiconductor device according to claim 6, further comprising a third semiconductor provided between said quantum box in said first semiconductor and said second semiconductor and having a forbidden bandgap larger than the forbidden bandgap of said first semiconductor.

13. The semiconductor device according to claim 6, wherein said first semiconductor is composed of one or a plurality of material(s) selected from the group consisting of an AlGaAs system, an InAlAs system, an InAlGaAs system, a GaAsP system and an AlGaAsP system, said second semiconductor is composed of one or a plurality of material (s) selected from the group consisting of a GaAs system, an InGaAs system and an InP system, and said quantum box is composed of one or a plurality of material(s) selected from the group consisting of an InAs system, an InGaAs system, a GaSb system, and an InSb system.

14. The semiconductor device according to claim 6, wherein said quantum box has a structure which confines a carrier in a size of not more than 1000 Å in three directions normal to one another.

15. A semiconductor device as in claim 6 wherein said device has a first state in which an electron is accumulated in said quantum box and a second state in which no electron is accumulated in said quantum box, wherein when the magnitude of the energy of the electron drifting in said channel region becomes greater than the energy for accumulating an electron in said quantum box in said second state, said device is switched to said first state.

16. A semiconductor device, comprising:
   a hetero structure including a first semiconductor including a layer doped with impurity and an undoped second semiconductor having a forbidden bandgap smaller than a forbidden bandgap of said first semiconductor, and
   a quantum box provided in a position separated from a channel region in which electrons drift through a potential barrier;
   said quantum box including a semiconductor having a forbidden bandgap smaller than the forbidden bandgap of said second semiconductor and said second semiconductor having a channel region therein in which electrons drift, said quantum box being provided in a position separated from said channel region in said second semiconductor, and no potential barrier formed by said quantum box exists in said channel region.

17. The semiconductor device according to claim 16, wherein said first semiconductor includes an undoped layer between said impurity-doped layer and said second semiconductor.

18. The semiconductor device according to claim 16, further comprising first and second electrodes for supplying electrons from a side of said second semiconductor to a channel formed in said second semiconductor.

19. The semiconductor device according to claim 16, further comprising a third electrode for producing an electric field between a channel in said second semiconductor and said quantum box.

20. The semiconductor device according to claim 16, wherein capacitance between a channel formed in said second semiconductor and said quantum box is smaller than about $10^{-16}$ F.

21. The semiconductor device according to claim 16, further comprising a third semiconductor provided adjacent to a channel formed in said second semiconductor and having a forbidden bandgap smaller than the forbidden bandgap of said second semiconductor.

22. The semiconductor device according to claim 16, further comprising a third semiconductor provided between a channel formed in said second semiconductor and said quantum box and having a forbidden bandgap larger than the forbidden bandgap of said second semiconductor.

23. The semiconductor device according to claim 16, wherein said first semiconductor is composed of one or a plurality of material(s) selected from the group consisting of an AlGaAs system, an InAlAs system, an InAlGaAs system, a GaAsP system and an AlGaAsP system, said second semiconductor is composed of one or a plurality of material (s) selected from the group consisting of a GaAs system, an InGaAs system and an InP system, and said quantum box is composed of one or a plurality of material(s) selected from the group consisting of an InAs system, an InGaAs system, a GaSb system, and an InSb system.

24. The semiconductor device according to claim 16, wherein said quantum box has a structure which confines a carrier in a space of not more than 1000 Å in three directions normal to one another.

25. A semiconductor device as in claim 16 wherein said device has a first state in which an electron is accumulated in said quantum box and a second state in which no electron is accumulated in said quantum box, wherein when the magnitude of the energy of the electron drifting in said channel region becomes greater than the energy for accumulating an electron in said quantum box in said second state, said device is switched to said first state.

26. A semiconductor device, comprising:
   a first layer formed of a first semiconductor having a channel formed therein in which electrons drift;
   a second layer formed of a second semiconductor or an insulator formed on said first layer and having a forbidden bandgap larger than a forbidden bandgap of said first layer; and
   a quantum box provided in said second layer for accumulating an electron in a position separated from said channel, there being no potential barrier in said channel resulting from said quantum box;
   said quantum box including a semiconductor or metal having a forbidden bandgap not higher than the forbidden bandgap of said first layer.

27. The semiconductor device according to claim 26, further comprising first and second electrodes for supplying electrons to said channel in said first semiconductor.

28. The semiconductor device according to claim 27, further comprising a third electrode for producing an electric field between said channel in said first semiconductor and said quantum box.

29. The semiconductor device according to claim 26, wherein capacitance between said channel in said first semiconductor and said quantum box is smaller than about $10^{-16}$ F.

30. A semiconductor device comprising:
   a first layer formed of a first semiconductor having a channel formed therein in which electrons drift;
   a second layer formed of a second semiconductor or an insulator formed on said first layer and having a forbidden bandgap larger than a forbidden bandgap of said first layer; and
   a quantum box provided in said second layer for accumulating an electron;
   said quantum box including a semiconductor or metal having a forbidden bandgap not higher than the forbidden bandgap of said first layer, wherein
      said first layer is composed of silicon, said second layer is composed of an oxide film, and said quantum box includes a silicon, germanium or metal fine particle.

31. A semiconductor device, comprising:
   a hetero structure including a first semiconductor including a layer doped with impurity and an undoped second semiconductor having a forbidden bandgap smaller than a forbidden bandgap of said first semiconductor, said second semiconductor having a channel therein in which electrons drift; and a quantum box provided in said first semiconductor in a position separated from said channel with a potential barrier interposed therebetween for accumulating an electron;

said quantum box including a semiconductor having a forbidden bandgap smaller than the forbidden bandgap of said first semiconductor; and a third semiconductor provided adjacent to said channel formed in said second semiconductor and having a forbidden bandgap smaller than the forbidden bandgap of said second semiconductor.

32. A semiconductor device, comprising:

a channel region in which electrons drift;

a quantum box provided in a position separated from said channel region with a potential barrier interposed therebetween, for accumulating an electron;

a hetero structure including a first semiconductor including a layer doped with impurity and an undoped second semiconductor having a forbidden bandgap smaller than a forbidden bandgap of said first semiconductor, a quantum box provided in said first semiconductor for accumulating an electron;

said quantum box including a semiconductor having a forbidden bandgap smaller than the forbidden bandgap of said first semiconductor; and a third semiconductor provided between said quantum box in said first semiconductor and said second semiconductor and having a forbidden bandgap larger than the forbidden bandgap of said first semiconductor.

33. A semiconductor device, comprising:

a hetero structure including a first semiconductor including a layer doped with impurity and an undoped second semiconductor having a forbidden bandgap smaller than a forbidden bandgap of said first semiconductor, said second semiconductor having a channel therein in which electrons drift;

a quantum box provided in said first semiconductor in a position separated from said channel with a potential barrier interposed therebetween for accumulating an electron; and a third semiconductor provided adjacent to said channel formed in said second semiconductor and having a forbidden bandgap smaller than the forbidden bandgap of said second semiconductor.

34. A semiconductor device, comprising:

a hetero structure including a first semiconductor including a layer doped with impurity and an undoped second semiconductor having a forbidden bandgap smaller than a forbidden bandgap of said first semiconductor, said second semiconductor having a channel therein in which electrons drift;

a quantum box provided in said first semiconductor in a position separated from said channel with a potential barrier interposed therebetween for accumulating an electron; and a third semiconductor provided between said channel formed in said second semiconductor and said quantum box and having a forbidden bandgap larger than the forbidden bandgap of said second semiconductor.

* * * * *